United States Patent
Arisaka et al.

(10) Patent No.: US 10,107,355 B2
(45) Date of Patent: Oct. 23, 2018

(54) ACTIVE DAMPING DEVICE AND DESIGN METHOD

(71) Applicant: HITACHI, LTD., Tokyo (JP)

(72) Inventors: Toshihiro Arisaka, Tokyo (JP); Takashi Saegusa, Tokyo (JP); Daisuke Matsuka, Tokyo (JP)

(73) Assignee: HITACHI LTD., Tokyo (JP)

( * ) Notice: Subject to any disclaimer, the term of this patent is extended or adjusted under 35 U.S.C. 154(b) by 82 days.

(21) Appl. No.: 15/306,418

(22) PCT Filed: Apr. 25, 2014

(86) PCT No.: PCT/JP2014/061648
§ 371 (c)(1),
(2) Date: Oct. 24, 2016

(87) PCT Pub. No.: WO2015/162772
PCT Pub. Date: Oct. 29, 2015

(65) Prior Publication Data
US 2017/0045109 A1    Feb. 16, 2017

(51) Int. Cl.
*G05D 19/02* (2006.01)
*G05B 15/02* (2006.01)
(Continued)

(52) U.S. Cl.
CPC ............ *F16F 15/002* (2013.01); *F16F 15/02* (2013.01); *G05B 15/02* (2013.01); *G05D 19/02* (2013.01); *G06F 17/50* (2013.01)

(58) Field of Classification Search
CPC ......... F16F 15/002; F16F 15/02; G06F 17/50; G05D 19/02; G05B 15/02
(Continued)

(56) References Cited

U.S. PATENT DOCUMENTS

| | | | |
|---|---|---|---|
| 6,472,840 B1* | 10/2002 | Takahashi | F16F 7/1005 318/611 |
| 2006/0119026 A1* | 6/2006 | Ryaboy | F16F 15/02 267/140.15 |
| 2015/0250547 A1* | 9/2015 | Fukushima | G05B 15/02 606/130 |

FOREIGN PATENT DOCUMENTS

| | | |
|---|---|---|
| JP | 9-291968 A | 11/1997 |
| JP | 10-227149 A | 8/1998 |

(Continued)

OTHER PUBLICATIONS

The Extended European Search Report dated Jan. 5, 2018 for the European Application No. 14890362.8.
(Continued)

*Primary Examiner* — Ziaul Karim
(74) *Attorney, Agent, or Firm* — Volpe and Koenig, P.C.

(57) ABSTRACT

A damping device and a design method provide an active damping for a device in which vibration is to be reduced. The damping device includes vibration detection means for detecting a vibration of the object; vibration generation means for generating a distortion on a portion of the object; control means for controlling the vibration generation means by a signal from the vibration detection means; and signal input and output means for transferring a signal with the control means. A driving force generation signal is received from outside through the signal input and output means, the driving force corresponding to the driving force generation signal is generated by the control means, the selected vibration generation means is driven by the driving force, and vibration state information obtained from the selected vibration detection means is output from the control means to the outside through the signal input and output means.

7 Claims, 7 Drawing Sheets

(51) Int. Cl.
*F16F 15/00* (2006.01)
*F16F 15/02* (2006.01)
*G06F 17/50* (2006.01)

(58) Field of Classification Search
USPC .................................................. 700/282, 280
See application file for complete search history.

(56) References Cited

FOREIGN PATENT DOCUMENTS

| | | |
|---|---|---|
| JP | 2000-275370 A | 10/2000 |
| JP | 2007-120711 A | 5/2007 |
| WO | 2014/192088 A | 12/2014 |

OTHER PUBLICATIONS

Active Damping Devices and Inertial Actuators, Micromega Dynamics, Theory of Operation, pp. 1-22.

* cited by examiner

ACTIVE DAMPING DEVICE AND DESIGN METHOD

TECHNICAL FIELD

The present invention relates to an active damping device and a design method therefor.

BACKGROUND ART

As a background of this technology, JP-A-2007-120711 has been disclosed. In the application, with respect to a range of frequency of a damping object, a plurality of frequencies are selected and then control systems per each selected frequency are designed in advance. In this state, a control system designed to have a frequency which is the closest frequency to the natural frequency of the damping object is selected among the designed control systems and then the selected control system is incorporated into a controller of an active damping device.

CITATION LIST

Patent Literature

PTL 1: JP-A-2007-120711
PTL 2: WO2014/192088

SUMMARY OF INVENTION

Technical Problem

An object of the invention is to suppress a vibration of a device in which the influence of the vibration is to be eliminated.

For example, with respect to an information storage device on which a plurality of recording devices is mounted, a fault which leads to reduction in performance of the information storage device generated by vibration will be described. Here, a storage device on which a HDD (a hard disk drive) as a recording device generally used is mounted will be described. The HDD Generates the vibration by the HDD itself due to the spindle of the actuator and the disk in the HDD being operated. The vibration is transferred to a HDD which is attached to the storage device and in which any input and output are not performed, through a housing of the storage device and thus the HDD in which input and output are not performed vibrates. An operation of a HDD in which input and output are performed is affected and an amount of input and output is adversely affected by the vibration from the HDD in which input and output are not performed being overlapped in multiple and being transferred to the HDD in which input and output are performed as an external vibration. In addition, in order to cool the device, it is often equipped with a fan for dissipating heat by forcibly circulating the air. In this case, there is a case that the vibration generated by the operation of the fan is transferred to the HDD in which input and output are performed through the housing of the storage device as an external vibration.

In addition to this, suppression of the vibration is an important challenge in a device in which vibration needs to be eliminated, since the performance of such device such as a piece of measurement equipment, for example, an electron microscope which needs to capture an image of a very small area with a high degree of accuracy or a manufacturing device which performs ultra-fine processing is reduced by vibration. In addition to this, the vibration of a structural body is a generation source of noise and thus the added value of the device may be reduced.

As a method for reducing the vibration, PTL 1 discloses an active vibration control device which detects the vibration of an object, generates a control signal for suppressing the vibration, drives a vibration generation means and then reduces the vibration. Hereinafter, the device refers to as an active damping device. The active damping device has been widely used from the prior and is known to have a higher damping performance than a passive damping device. On the other hand, the active damping device is difficult to design and needs to be specially designed for the application object and thus the cost of such a damping device is increased.

In the details described in the application, application or modified application of a control system prepared in advance according to the frequency of an object is disclosed. While this method is capable of reducing the number of man-hours occurring when an active damper is designed, advantages of this method are not sufficiently taken with respect to an object which is not prepared and there is a problem that the man-hour for development at the stage increases as the control system to be prepared in advance increases. Further, in the active damping, in the design of the damping device, it is not enough to simply identify frequencies by which an amplitude is reduced. In other words, various items required for the design thereof such as in which part of the object the active damping device is installed or what construction the active damping device has are needed and thus this is a reason why the design thereof described above is difficult.

With respect to this, in an active damper in PTL 2, "a damping device attached to a structural body of an object of which vibration is to be reduced is configured to include a plurality of same vibration detection means for detecting a distortion of a portion of an object, a plurality of same vibration generation means for generating a distortion to a portion of the object which is in a different place, and control means for generating a control signal determining driving force of the vibration generation means by a signal from the vibration detection means." In this construction, the vibration detection means for detecting vibration and the vibration generation means for generating driving force reducing the object vibration can be installed on any position of the object and can be arranged in a more efficient position in suppressing the vibration. In designing the active damper, if frequency as an object is promptly found and the efficient positions of the vibration detection means or the vibration generation means are specified with a small effort, the man-hour which is required for the design of the vibration damper is dramatically reduced.

An object of the present invention is to realize a method for efficiently designing a damping device having a high damping performance with a low cost, which is added to a device in which the influence by the vibration is to be reduced and a housing is further vibrated by vibration sources in the device.

Solution to Problem

In order to solve the above task, the present application provides a damping device to a structure body of an object of which a vibration is to be reduced, including a plurality of vibration detection means for detecting a vibration of a portion of the object; a plurality of vibration generation means for generating a distortion on a portion of the object;

control means for generating a control signal determining driving force of the vibration generation means by a signal from the vibration detection means; signal input and output means for performing transferring of a signal with the control means; signal analyzing means which is provided ahead of the signal input and output means; and a display device which displays a calculation result by the signal analyzing means. The present application further provides a design method for the damping device, including measuring a driving force generation signal and vibration state information for each combination of the vibration detection means and the vibration generation means by switching the plurality of vibration detection means and the plurality of vibration generation means, displaying a result of transfer characteristics which is calculated by the signal analyzing means on the display device, and selecting a combination of the vibration detection means and the vibration generation means which is considered as the most appropriate combination among the combinations by an operator.

Advantageous Effects of Invention

In the related art, in the active damping device which is specially designed according to individual devices, to design in consideration of the construction and the design method according to an object, a long time takes to design or a designer having a professional knowledge is required. By this, the cost of the damping device increases. In addition, the vibration characteristic of the actual object device may also be different from the vibration characteristic assumed at the time of design. In the present invention with respect this, by providing a plurality of vibration detection means whose shape and nature are uniformized according to the almost same standards, the vibration state of the object can be well measured and on the other hand, by providing the vibration generation means whose shape and nature are uniformized according to the almost same standards, the driving force which can efficiently reduce the vibration of the object can be generated by determining the number and disposition of the vibration generation means in advance according to the characteristic of the object. Through the signal input and output means connected to the control means which controls driving force, the vibration state information from the vibration detection means can be output to outside of the damping device and reversely the driving force generation signal from outside can be input and the driving force is generated by the vibration generation means according to the signal and thus the object is vibrated. In this way, the vibration characteristic of the object itself can be grasped, and in addition, since a piece of additional equipment such as a vibration damper and a vibration measuring device is not required, the rapid grasp of the vibration phenomenon is possible.

It is possible to calculate the transfer characteristics in the object from a certain vibration generation means to a certain vibration detection means from the vibration state information from the vibration detection means and the driving force generation signal which has a one-to-one relationship with the driving force generated in the vibration generation means by providing the signal analyzing means ahead of the signal input and out means. The operator (=designer) can visually grasp the vibration state of the objects by displaying the result calculated per combination of the vibration generation means and the vibration detection means, can select a combination of the vibration generation means and the vibration detection means considered to be most appropriate among the combinations of the vibration generation means and the vibration detection means and can complete the design of the damping device y further adjusting a control parameter of the control means at this time and can easily and quickly cope with vibration problems.

In addition, the operator can grasp overall vibration state by displaying a plurality of transfer characteristics in display means from the vibration generation means to the vibration detection means. However, at this time, if the plurality of transfer characteristics are displayed in parallel together with a frequency axis, the size of the vibration in each transfer characteristic can be easily grasped and the design is easy performed by highlighting where a problematic frequency is. Alternatively, the size of the vibration in a problematic frequency can be easily grasped by displaying the transfer characteristics in an overlapping manner.

According to the above, the active damping device of which design is difficult and application barrier is high in the related art can be introduced by low cost and simple design, the present invention can quickly cope with the device in which vibration problem is generated, and can increase an added value of the object device by guaranteeing performance.

The details of task, construction and effects other than those described above will be more apparent in the following description of embodiments.

DESCRIPTION OF EMBODIMENTS

Hereinafter, in a description of an example, an object of which vibration is to be reduced is described as an information storage device using a RAID device for example.

Example 1

Figure 1:
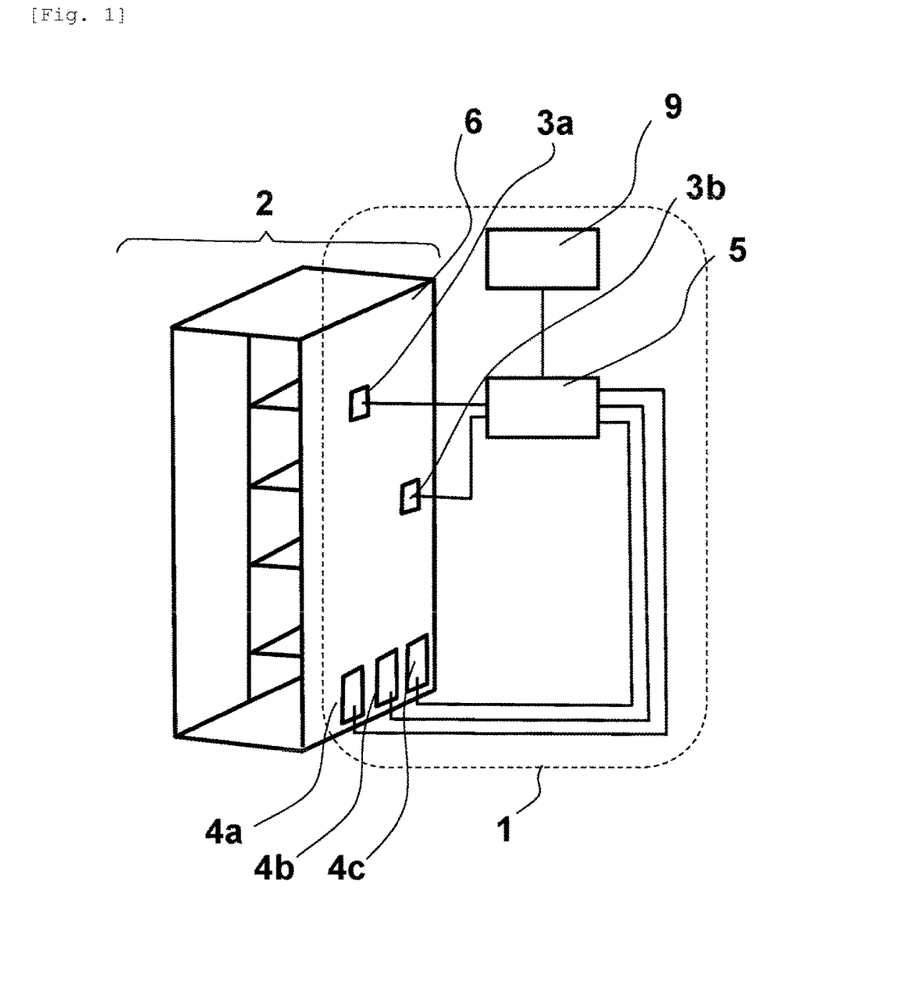
FIG. 1 is a schematic view illustrating Example 1.
Figure 2:
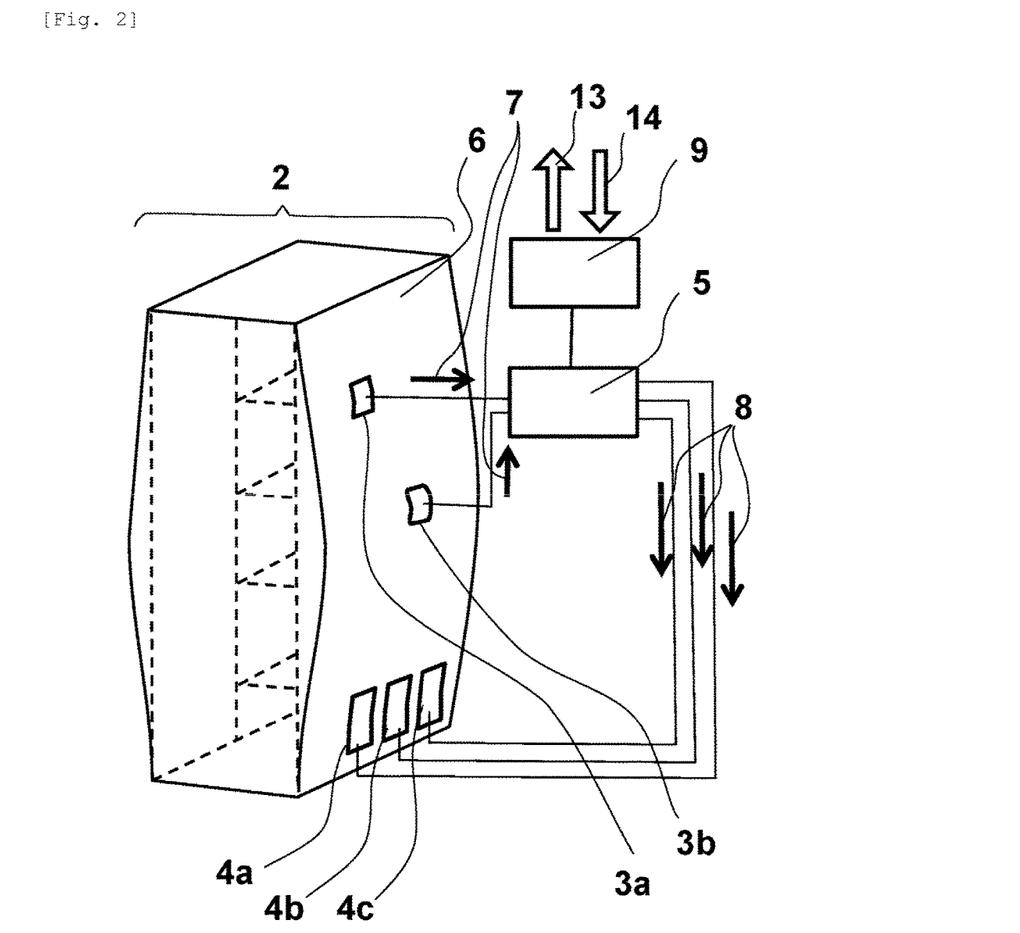
FIG. 2 is a schematic view illustrating an operation of Example 1.
Figure 3:
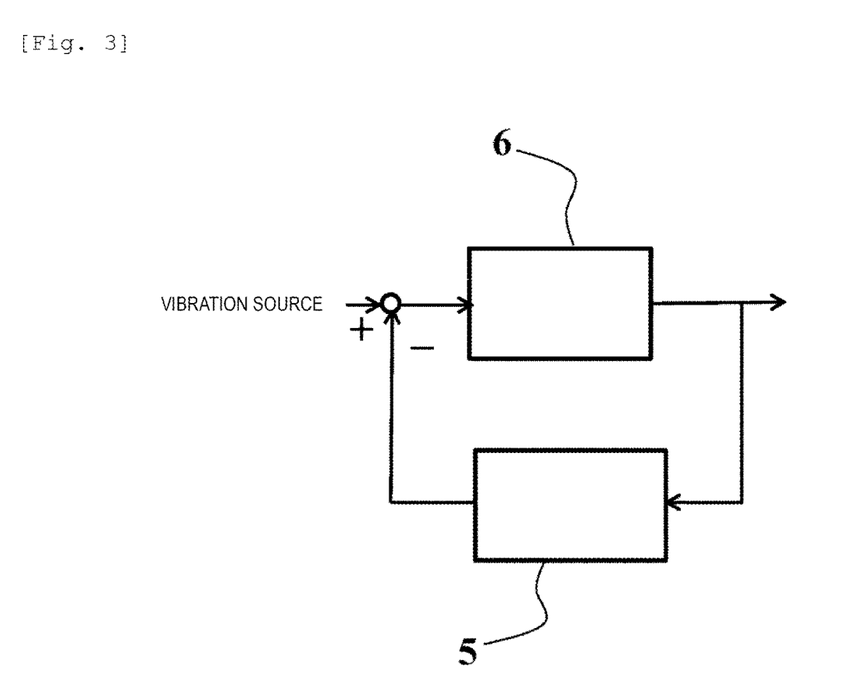
FIG. 3 is a block diagram of Example 1.

FIG. 1 is a schematic view illustrating Example 1. FIG. 1 is an example in which an active damping device 1 of the present invention is mounted on a storage device 2 as an object. Piezoelectric sensors 3a and 3b are attached to a structural plate 6 of a side surface of a housing of the storage device 2. In addition, plate-shaped piezoelectric actuators 4a, 4b and 4c are attached to another portion of the structural plate 6 and the piezoelectric sensors 3a and 3b and the piezoelectric actuators 4a, 4b and 4c are connected to a controller 5. How to reduce the vibration of the structural plate 6 of the storage device 2 will be described using FIG. 2. FIG. 2 is a simplified view illustrating a case where the structural plate 6 is bent by vibration. The dotted line in the FIG. 2 represents an original shape of the storage device 2. A deformation illustrated by a solid line is generated by the vibration of the storage device 2, the structural plate 6 is bent, the piezoelectric sensors 3a and 3b are deformed as the deformation of the structural plate 6 and thus a voltage output 7 is output according to the amount of distortion. The voltage output is input to the controller 5. A feedback circuit illustrated in FIG. 3 is formed so that the voltage output 7 is zero in frequency as an object in the controller 5. Therefore a control output 8 is transmitted to the piezoelectric actuators 4a to 4c. The piezoelectric actuators 4a, 4b and 4c generate distortion according to the control output 8 and deform so that vibration with respect to the structural plate is suppressed. Therefore the vibration generated to the structural plate 6 is reduced.

In this example, two sensors are used as the piezoelectric sensor 3a and 3b. When the vibration as an object increases, in other words, in a case where the number of the vibration mode which is to be dealt with increases in the storage device 2, a lot of vibration is capable of being detected by increasing the number of the piezoelectric sensors 3, which is preferable. This is because since a portion which is greatly vibrated is different according to the vibration mode, the vibration mode of which detection is difficult is present according to the position of the sensor, in a case where the vibration mode is detected by one sensor as in the related art. Furthermore, in a case where the storage device 2 has a substantially box type housing as the storage device 2 of this example, the vibration mode exhibits a complex aspect (FIG. 2 illustrates a simplified state for explanation). Accordingly, desirably, the piezoelectric sensors 3 are also attached to other components without limiting to the structural plate 6 as one component.

Similarly, also regarding to the piezoelectric actuators 4 having a role which causes the structural plate 6 to be deformed so that vibration is reduced, in order to obtain great driving force as the deformation is generated to the structural plate 6 with respect to the vibration mode as an object, it is desirable to use a plate-shaped piezoelectric element having larger area.

However, it is difficult to obtain a place to which the plate-shaped piezoelectric element having large area is attached. In addition, the manufacturing cost of the piezoelectric element having a large area increases from the difficulty of manufacture thereof. In the device of the present invention, the driving force which can efficiently reduce the vibration of an object is generated by using a plurality of plate-shaped piezoelectric actuators 4 of which the shape and the performance are aligned according to the same standard, obtaining the driving force thereof as a whole and determining the number and the placement of the vibration generation means in advance according to the properties of the object.

Here, the piezoelectric element is used as the vibration detection means. However, other vibration generation means such as a sensor for detecting the acceleration or a sensor for detecting displacement or speed may be used. On the other hand, the piezoelectric actuator is used as the vibration generation means. However, vibration generation means of the type using inertial force such as by movement of a weight by the electromagnetic actuator may be used.

In FIG. 1 and FIG. 2, a signal input and output interface 9 connected to the controller 5 is capable of outputting a signal state signal 13 which is proportional to the voltage output 7 transmitted from the piezoelectric sensors 3a and 3b in the controller 5. In addition a driving force generation signal 14 input from outside is transmitted to the piezoelectric actuators 4a to 4c, in a superimposing state to the control input 8. According to the construction, since the sensors and the actuators included in the damping device 1 can be used, it is not necessary to newly prepare a sensor for measuring vibration or an actuator (a vibrator) for vibrating an object.

It is possible to significantly reduce time which is required to solve the vibration problem since the vibrational state of the object can be immediately grasped in a case where the vibration problem has become emerged and data required for design and adjustment of the damping device can be collected. In the active damping device in the related art, in order to grasp a vibration state with respect to the device of the object (which frequency is a problem, or vibration amplitude of which portion is large) in a first place, time and facility margins were necessary since a vibrator and a measuring device are prepared, measurement is performed and then the design of the damping device is initiated based the results of the measurement.

In addition, by providing the signal input and output interface 9 with outside in the damping device 1, during the operation of the damping device 1, the signal input and output interface 9 may be used for monitoring of operation of the damping device 1. Since the damping device 1 may be easily maintained after applying a change of the operation of the damping device or a significant change of the characteristic of the object, as well as at the time of design thereof, values of products including the service are increased.

According to the example, with respect to the active damping device of related art, the present invention can be simply designed without other equipment being required, since the time required for the design is reduced and the sensors and the actuators which are included in the damping device itself may be used. Compared to a passive damping device which is widely used, it will become apparent with reference to the present example, the active damping device which is difficult to introduce in terms of cost and design man-hour, even though it has high damping performance, becomes widely applicable to various devices.

Example 2

Figure 4:
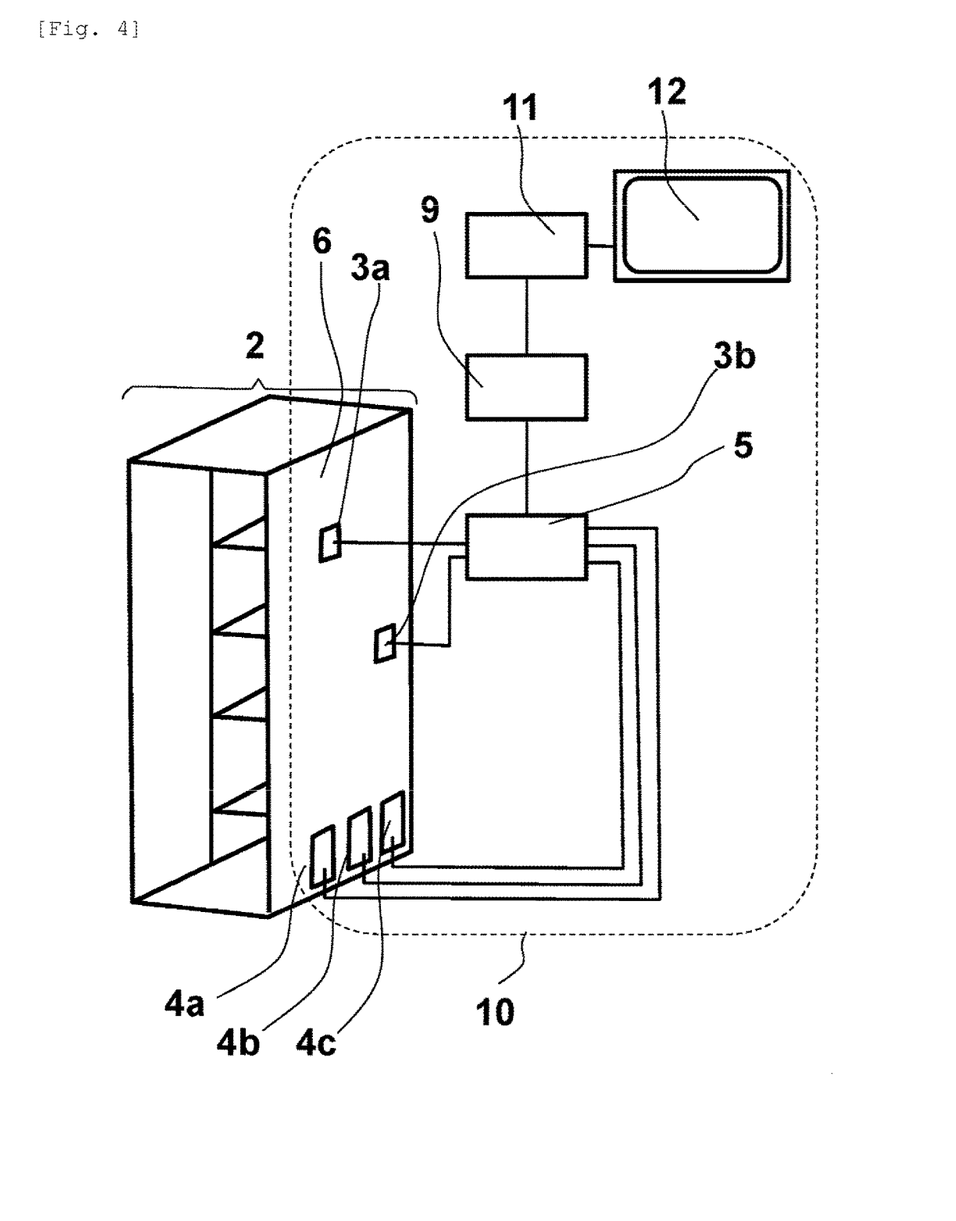
FIG. 4 is a schematic view illustrating Example 2.

FIG. 4 is Example 2 of the present invention. The configuration of piezoelectric sensors 3a and 3b, piezoelectric actuators 4a to 4c, a controller 5 and a signal input and output interface 9 is the same as that of Example 1. As a preferable configuration at the time of design of a damping device 1 of the present example, an active damping design system 10 in which an analyzing device 11 and a display device 12 which displays an analyzing result of the analyzing device 11 are included ahead of the signal input and output interface 9 is illustrated.

The analyzing device 11 and the display device 12 install an interface for exchanging signals with the signal input and output interface 9 on the base as a general personal computer, and have a function of transmitting a vibration state signal 13 or a driving force generation signal 14 sent from the signal input and output interface 9 by software.

Further, on the software, the signal from any of the piezoelectric sensors 3a and 3b can be selected and the driving force signal sent to the piezoelectric actuators 4a to 4c can be also selected. By doing so, the driving force is generated in a certain actuator, and the vibration state generated on the object (the storage device 2) at this time can be measured by a certain censor. At this time, in the manner of the following formula (1), transfer characteristic of an object from the actuator to the sensor is calculated in the analyzing device 11.

(transfer characteristic of an object after Fourier trans form)=(vibration state information after Fourier transform)/(driving force generation signal to an object after Fourier transform)　　(1)

The transfer characteristic indicates that how vibration amplitude and phase of the object change depending on the frequency. In general, the vibration of which the vibration amplitude is large (the vibration peak) is a problem. When mounting positions of the sensor and the actuator is different from each other, since which vibration mode is affected is different, the transfer characteristic is changed by the selected combination of the sensor and the actuator.

In general, when the vibration problem is solved, the problematic frequency is determined. The problematic frequency is different according to the cases such as in a case where a frequency has an especially large vibration peak compared to other vibration peak or other important component has frequency which easily overreacts on the problematic frequency. Accordingly, a designer of the damping device performs design of the damping device by considering the transfer characteristic by paying attention to the problematic frequency. All or a portion of the combination of the plurality of sensors and actuators as described above in the present example are measured and the combination of which frequency peak is large is selected in the problematic frequency among the frequency, for example. In the combination of the sensor and the actuator of which vibration peak is maximum, when the damping device 1 is actually operated, since it means that the actuator and the sensor are installed in positions in that the driving force from the actuator is efficiently applied to the object or the vibration of the object can be effectively measured, it is possible to determine the positions as the mounting positions of the sensors and the actuators. Of course, properties in a case where a plurality of sensors (in this example, the piezoelectric sensors 3a and 3b) and a plurality of actuators (in this example, the piezoelectric actuators 4a to 4c) are driven can be considered.

In addition, as an example, the combination of which the vibration peak is large in the problematic frequency is selected. However, a case where the vibration peak is maximized may not necessarily selected according to intention of the designer. This is a case where the object itself is measured and then vibration reduction of the object is considered. However, in applying the same damping device 1 to other object of the same design, the case of the preferred selection as a whole, or the like corresponds to this.

Figure 5:
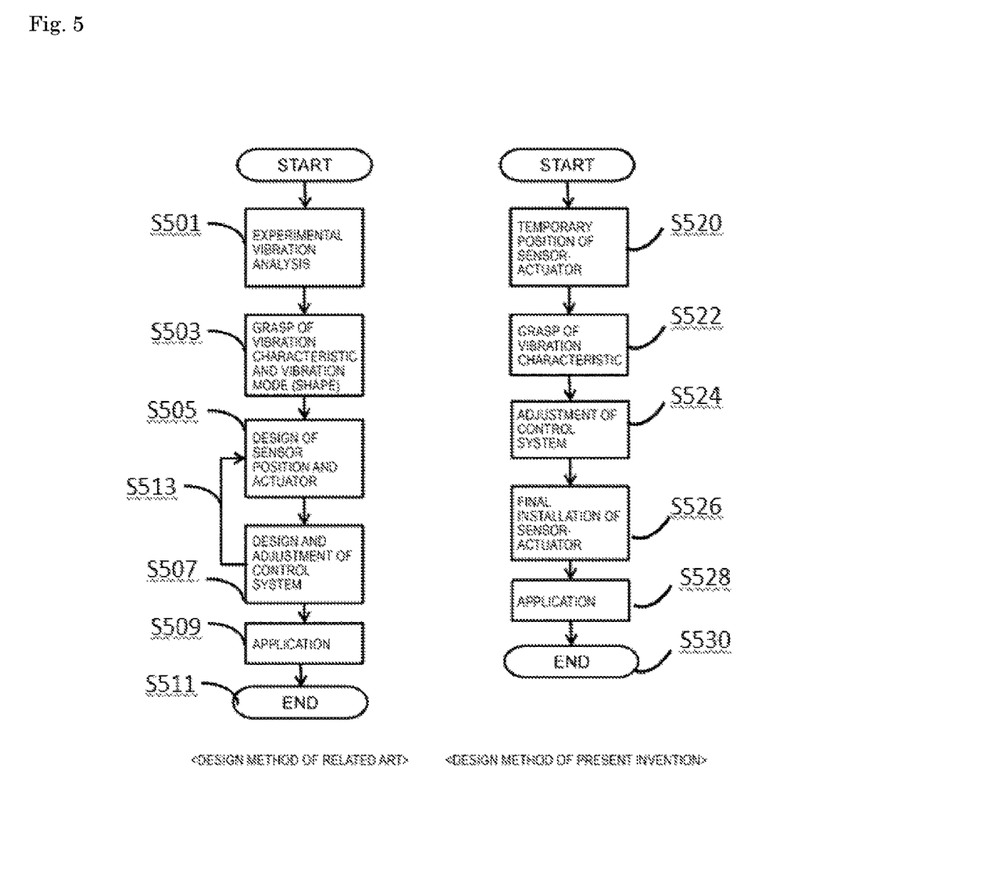
FIGS. 5A and 5B are is a flow charts comparing a design method of Example 2, FIG. 5B and the method of the related art, FIG. 5A with each other.

In a case where the vibration problem of the object is generated, the design method of the active damping device of the related art and the design method of the active damping device of the present example are illustrated in FIGS. 5A and 5B. As illustrated in FIG. 5A, in the design method of the active damping device of the related art, experimental vibration analysis is started S501, flow of grasp of the vibration characteristic of the object S503, modeling, selection or design of the sensor and the actuator S505, consideration of the installation positions of the sensor and the actuator S505, and the design of the control system S507 is made S509, and in some cases, it takes time corresponding to the flow including the case to return to the previous process S513. On the other hand in FIG. 5B, the plurality of sensors 3a and 3b and the plurality of actuators 4a to 4c are temporarily installed S520, the plurality of sensors 3a and 3b and the plurality of actuators 4a to 4c are switched, the driving force generation signal and the vibration state information with respect to each combination of the sensor and the actuator are measured, and then the transfer characteristic is calculated from the formula (1) by the analyzing device 11. The vibration characteristic of the object can be grasped according to this S522, the list of the results of these is displayed on the display device 12, and a combination of the sensor and the actuator which is considered to be most appropriate is selected from among the list by the operator. At this time, it is more convenient that the adjustment of a control system is performed at the same time S524. Then, the sensor and the actuator are installed on the positions which are considered to be appropriate S526, where treatment such as an insulating treatment and protection process is performed S528, and thus the design of the active vibration damper is completed S530. Not only the design method of the present invention is simpler than the design method of the related art, but also a series of operations proceeds only at the active damping device design system 10, the present invention is not required for other equipment. In other words, when effort which is not illustrated in FIGS. 5A and 5B that a piece of equipment such as other measuring equipment is prepared is considered, it is apparent that the design method of the present invention is useful in terms of the time. Accordingly, the man-hour and the cost required to the design may be significantly reduced.

Figure 6:
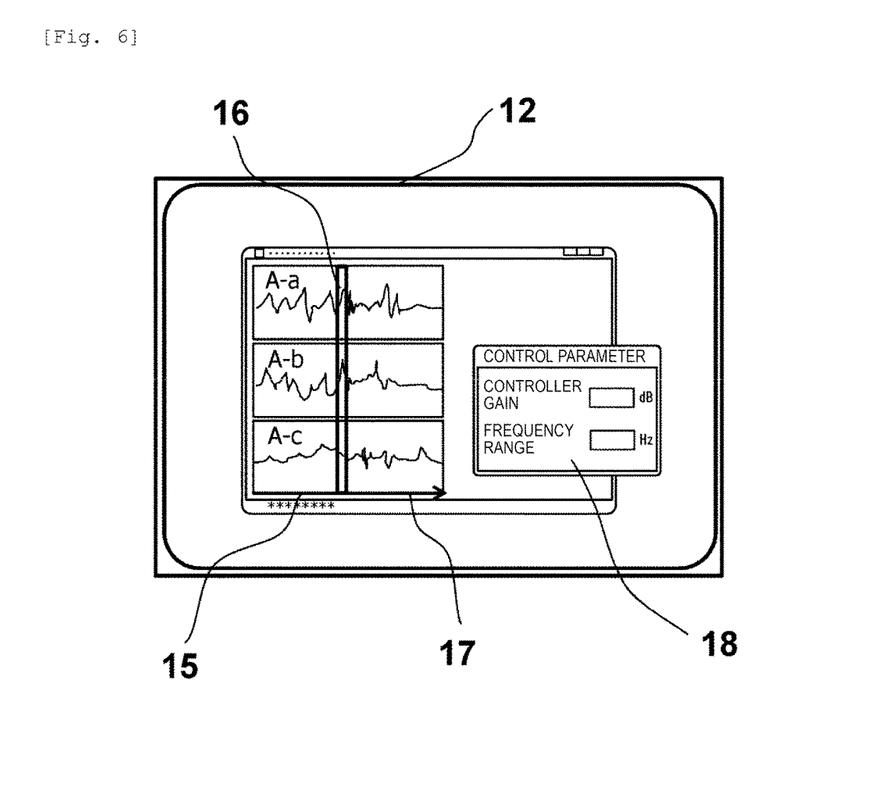
FIG. 6 is a schematic view illustrating a display example of Example 2.

A list of the transfer characteristics displayed on the display device 12 and an adjustment screen of the control system parameter are illustrated in FIG. 6 as an example. After the transfer characteristic from the actuator to the sensor is analyzed by the formula (1), the operator can grasp the overall vibration state by plurality of transfer characteristics 15 of each combination (for example, curves illustrated by A-a, A-b, and A-c in FIG. 6 are the transfer characteristics) displayed on the display device 12. At this time, when the plurality of transfer characteristics 15 are aligned on a frequency axis 17, for example, displayed in parallel as the A-a, A-b, and A-c in FIG. 6, the size of the vibration is easily grasped in each transfer characteristic 15 by the position of the problematic frequency being displayed with a highlighting 16 and thus the design is easy. Alternatively, as illustrated in FIG. 7, the problematic frequency among the overall frequencies is more easily grasped and the sizes of the vibrations in the problematic frequency are also more easily compared with each other by displaying the curves showing the transfer characteristic 15, for example the transfer characteristic displayed with A-a, A-b, and A-c in FIG. 7 in an overlapped manner with each other.

Figure 7:
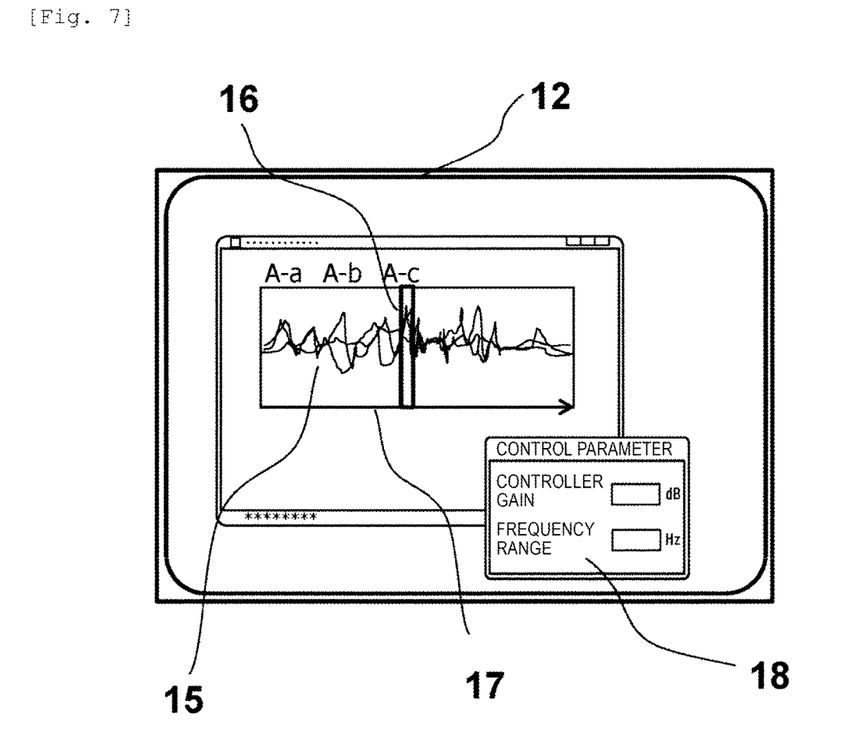
FIG. 7 is a schematic view illustrating another display example of Example 2.

In FIG. 6 and FIG. 7, it is further preferable for design if an adjustment screen 18 of the control parameter is displayed such that a parameter of the controller 5 such as a gain of the controller and a value by which how may Hz around the object frequency is reduced can be adjusted after the target frequency and the transfer characteristic 15 to be focused on have become apparent.

The screens in FIG. 6 and FIG. 7 are examples, and in addition to the above, information displayed state, information required to the design of the control parameter, or the like can be displayed.

In the examples as described above, the design of the active damping device 1 which is easier and quicker than that in the related art is possible and the man-hour of the product development and adjustment can be reduced by quickly solving the vibration problem of the object.

The present invention is not limited to Examples 1 and 2 and various modification examples are included in the present invention. For example, Examples 1 and 2 described above are described for easily understanding and explaining in detail the present invention and the present invention is not limited as one necessarily including the all constructions described. In addition, it is possible to displace a portion of a certain example with construction of other example, and to add construction of other example to a portion of a certain example. In addition, with respect to a portion of construction of each example, it is possible to add, delete and replace other configuration.

REFERENCE SIGNS LIST 1 active damping device
2 storage device
3 piezoelectric sensor
4 plate-shaped piezoelectric actuator
5 controller
6 structural plate
7 voltage output
8 control signal
9 signal input and output interface
10 active damping device design system
11 analyzing device
12 display device
13 vibration state signal
14 driving force generation signal
15 transfer characteristic
16 highlighting
17 frequency axis
18 adjustment screen of control parameter

The invention claimed is:

1. A damping device attached to a structure body of an object of which a vibration is to be reduced, the device comprising:
a vibration detection unit for detecting, via a piezoelectric sensor, the vibration of the structure body, is temporarily placed on the structure body;
a control device that receives a signal from the vibration detection unit, the signal being indicative of the detected vibration, and via a signal input/output device, further receiving a driving force generation signal from outside that is indicative of a force that is used to dampen the detected vibration, the control device outputs a control signal, the control signal being related to the driving force generation signal;
a vibration generation actuator, is temporarily placed on the structure body, and receives the control signal and initiates a distortion to the structure body to reduce the detected vibration based on the control signal; and
a signal analyzing device, coupled to the signal input/output device, receives and analyzes the applied driving force generation signal and subsequent detected vibration to calculate transfer characteristics based on the analysis;
wherein, the operator is capable of changing a control parameter in the control device for the vibration detection units and the vibration generation actuators,
wherein at least one of a second location of the vibration detection unit and a second location of the vibration generation actuator is determined based on the calculated transfer characteristics, and
wherein the transfer characteristics are indicative of how vibration amplitude of the object and phase of the object change depending on frequency.

2. The damping device according to claim 1, further comprising:
a display device receives the calculated transfer characteristics and displays the calculated transfer characteristics.

3. The method for reducing a vibration according to claim 1,
wherein the transfer characteristics obtained by a plurality of combinations of the driving force generation signals and the subsequent detected vibrations are displayed in a parallel manner together with a frequency axis on the display device.

4. The method for reducing a vibration according to claim 1,
wherein the transfer characteristics obtained by a plurality of combinations of the driving force generation signal and the subsequent detected vibrations are displayed in an overlapping manner on the display device.

5. A method for reducing a vibration of a structure body of an object via a damping device, comprising:
detecting the vibration of the structure via a plurality of vibration detection units comprising at least one piezoelectric sensor, temporarily placed on the structure body
receiving a signal from the plurality of vibration detection units, via a control device, the signal being indicative of the detected vibration, and via a signal input/output device, further receiving a driving force generation signal from outside that is indicative of a force that is used to dampen the detected vibration, the control device outputs a control signal being related to the driving force generation signal,
a plurality of vibration generation actuators, temporarily placed on the structure body, that receive the control signal and initiate a distortion to the structure body to reduce the detected vibration based on the control signal,
measuring the driving force generation signal and subsequent detected vibrations for each combination of the vibration detection units and the vibration generation actuators by switching the plurality of vibration detection units and the plurality of vibration generation actuators;
calculating a list of transfer characteristics via a signal analyzing device, sending the list of transfer characteristics to a display device;
displaying the list of the calculated transfer characteristics on the display device; and
selecting a combination of the vibration detection units and the vibration generation actuators which is considered as the most appropriate combination among the combinations by an operator;
wherein, the operator is capable of changing a control parameter in the control device for the selected combination of the vibration detection units and the vibration generation actuators,
wherein at least one of a second location of the plurality of vibration detection units and a second location of the plurality of the vibration generation actuators is determined based on the calculated transfer characteristics, and
wherein the transfer characteristics are indicative of how vibration amplitude of the object and phase of the object change depending on frequency.

6. The method for reducing a vibration according to claim 5,
wherein the transfer characteristics obtained by a plurality of combinations of the driving force generation signals and the subsequent detected vibrations are displayed in a parallel manner together with a frequency axis on the display device.

7. The method for reducing a vibration according to claim 5,
wherein the transfer characteristics obtained by a plurality of combinations of the driving force generation signal and the subsequent detected vibrations state information are displayed in an overlapping manner on the display device.

\* \* \* \* \*